US010355818B1

(12) United States Patent
Jha (10) Patent No.: US 10,355,818 B1
(45) Date of Patent: Jul. 16, 2019

(54) METHOD AND APPARATUS FOR CODEWORD BOUNDARY DETECTION FOR A SCRAMBLED REED SOLOMON CODE BITSTREAM

(71) Applicant: Cadence Design Systems, Inc., San Jose, CA (US)

(72) Inventor: Sarath Kumar Jha, Greater Noida (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 80 days.

(21) Appl. No.: 15/289,816

(22) Filed: Oct. 10, 2016

(51) Int. Cl.
| | | |
|---|---|---|
| *H04L 1/00* | (2006.01) | |
| *H03M 13/15* | (2006.01) | |
| *H03M 13/00* | (2006.01) | |

(52) U.S. Cl.
CPC ...... *H04L 1/0045* (2013.01); *H03M 13/1515* (2013.01); *H03M 13/1545* (2013.01); *H04L 1/0058* (2013.01)

(58) Field of Classification Search
CPC ........... H03M 13/151; H03M 13/1515; H03M 13/1545; H04L 1/0043; H04L 1/0052; H04L 1/0057; H04L 1/0065; H04L 1/0045; H04L 1/0058
See application file for complete search history.

(56) References Cited

U.S. PATENT DOCUMENTS

| | | | | |
|---|---|---|---|---|
| 5,771,244 A | * | 6/1998 | Reed ................... | H03M 13/151 714/752 |
| 6,064,748 A | * | 5/2000 | Hogan ................... | H04N 19/30 348/461 |
| 2001/0033611 A1 | * | 10/2001 | Grimwood ............ | H04J 3/0682 375/219 |
| 2003/0196160 A1 | | 10/2003 | Li et al. | |
| 2004/0042420 A1 | | 3/2004 | Agarwal et al. | |
| 2007/0073935 A1 | * | 3/2007 | Kim ......................... | G06F 13/38 710/62 |
| 2008/0040650 A1 | | 2/2008 | Lablans | |
| 2008/0056393 A1 | * | 3/2008 | Niu ..................... | H04L 27/2613 375/260 |
| 2009/0259921 A1 | * | 10/2009 | Chang ................. | H03M 13/153 714/782 |
| 2009/0271686 A1 | | 10/2009 | Jiang et al. | |
| 2009/0282320 A1 | | 11/2009 | Liao et al. | |
| 2012/0137197 A1 | | 5/2012 | Au et al. | |

(Continued)

OTHER PUBLICATIONS

Ericsson AB et al., "Common Public Radio Interface (CPRI); Interface Specification", CPRI Specification V7.0, Oct. 9, 2015.

*Primary Examiner* — Guy J Lamarre
(74) *Attorney, Agent, or Firm* — Foley & Lardner LLP (57) ABSTRACT

The present embodiments relate to methods and apparatuses for detecting a codeword boundary and/or performing codeword error correction for a bitstream comprising scrambled Reed Solomon codewords. In accordance with some aspects, detecting a codeword boundary involves the use of the parity and symbols from a previous window to help in detecting a codeword boundary when the next input bit is received. In accordance with other aspects, parity symbols are more efficiently updated for each successive candidate input bit. In accordance with still further aspects, error correction during codeword boundary detection can be either partially performed or completely bypassed.

10 Claims, 5 Drawing Sheets

(56) References Cited

U.S. PATENT DOCUMENTS

2012/0254704 A1* 10/2012 Ban ................... H03M 13/1515
714/784
2014/0281840 A1    9/2014 Mula et al.
2016/0285547 A1*  9/2016 Loprieno ........... H04B 10/0775
2016/0373379 A1* 12/2016 Mehta ................... H04L 49/357

* cited by examiner

METHOD AND APPARATUS FOR CODEWORD BOUNDARY DETECTION FOR A SCRAMBLED REED SOLOMON CODE BITSTREAM

TECHNICAL FIELD

The present embodiments relate generally to data error correction schemes, and more particularly to techniques for detecting a codeword boundary and/or performing codeword error correction for a bitstream comprising scrambled Reed Solomon codewords.

BACKGROUND

Reed-Solomon (RS) error correction is used in many applications, including consumer technologies such as DVDs, data transmission technologies such as WiMAX, broadcast systems such as DVB, and storage systems such as RAID. In general, RS error correction involves forming codewords using a generator polynomial, the codewords containing message symbols (e.g. symbols containing useful data) and parity symbols. The codewords are generally formed in a transmitter and sent to a receiver over a channel. An aspect of RS error correction is that a receiver is capable of correcting multiple errors in the received message symbols using the parity symbols, which errors might arise from a number of factors, such as corrupted communications affecting the channel.

In order to decode RS codewords to obtain message symbols, and perform error correction if necessary, a receiver must first detect the boundary of the codewords in a stream of transmitted bits or bit stream. This can be challenging and time-consuming in many applications, including applications in which the codewords are further subject to scrambling before transmission.

SUMMARY

The present embodiments relate to methods and apparatuses for detecting a codeword boundary and/or performing codeword error correction for a bitstream comprising scrambled Reed Solomon codewords. In accordance with some aspects, detecting a codeword boundary involves the use of the parity and symbols from a previous window to help in detecting a codeword boundary when the next input bit is received. In accordance with other aspects, parity symbols are more efficiently updated for each successive candidate input bit. In accordance with still further aspects, error correction during codeword boundary detection can be either partially performed or completely bypassed.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments are related to detecting a Reed-Solomon (RS) codeword boundary in a received bit stream. In some embodiments, the RS encoded codewords are further subject to scrambling before transmission. In these and other embodiments, parity and symbols from a previous codeword search window are used to help in detecting a codeword boundary when a next input bit is received and a new codeword search window is formed.

Figure 1:
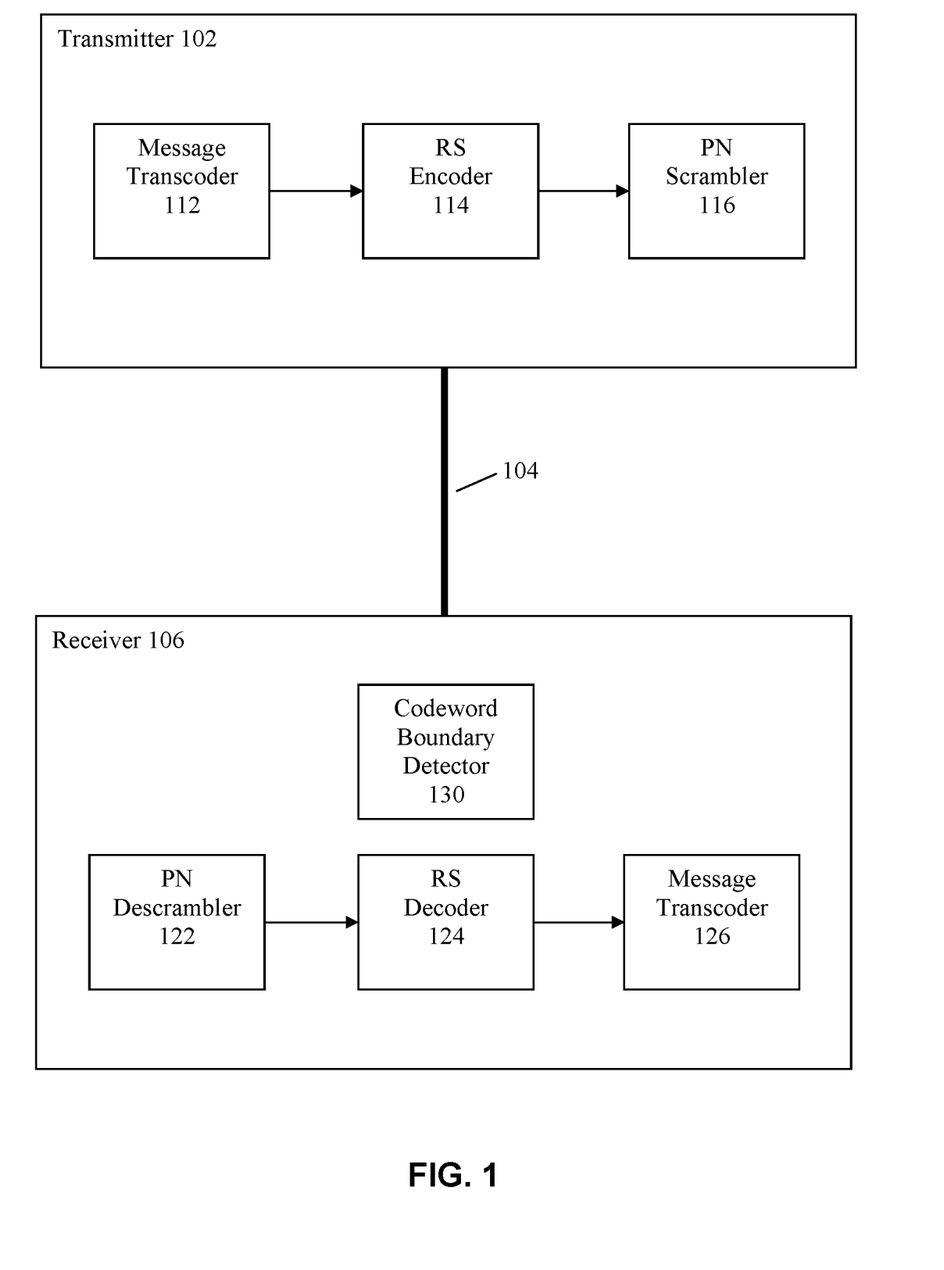
FIG. 1 is a block diagram illustrating an example application of principles of the embodiments in a data transmission scheme.

FIG. 1 is a block diagram illustrating aspects of an example application of embodiments of the invention in a transmission scheme.

As shown, in this example scheme, a transmitter 102 and receiver 106 communicate via a channel 104, for example a digital serial communication line. Channel 104 can be implemented by an electrical cable, an optical link, a backplane, a chip-to-chip interface. In some or all of these implementations, communications can be performed in accordance with a standard such as Fibre Channel (see, e.g., Fibre Channel Framing and Signaling-4 Rev 1.10, Aug. 5, 2014, hereinafter FC-FS-4). However, embodiments are not limited to this example application and the principles of the embodiments can be extended to other standard or proprietary communications. In embodiments to be described in more detail below, channel 104 can further implement a Common Public Radio Interface (CPRI) link (see, e.g., CPRI Specification V7.0, Oct. 9, 2015). However, the principles of these and other embodiments are not limited to this example application.

Figure 2:
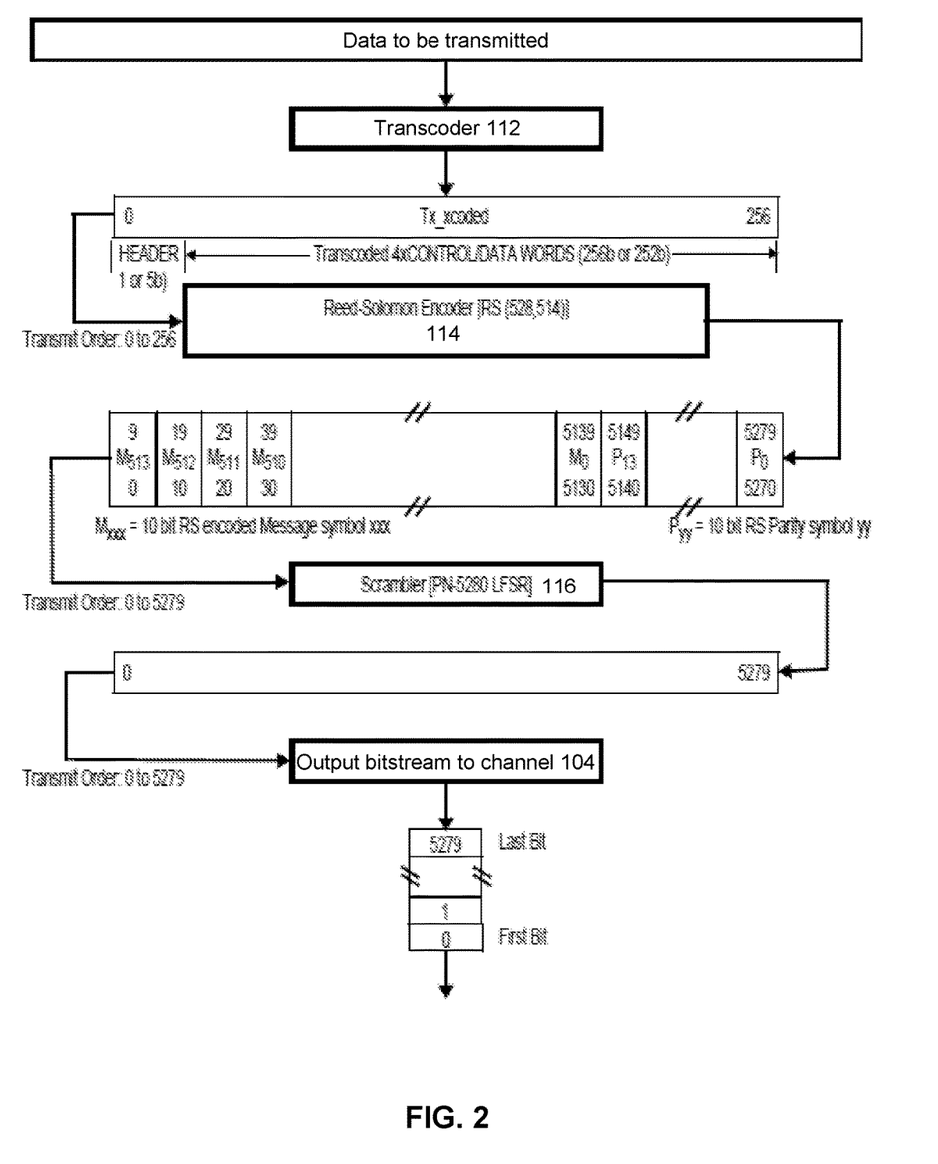
FIG. 2 is a flow diagram illustrating aspects of transmit bit ordering in accordance with some of the present embodiments.

In example CPRI and other similar embodiments, transmitter 102 can be incorporated in one of a Radio Equipment (RE) and a Radio Equipment Control (REC) of a radio base station and includes a message transcoder 112, a RS encoder 114 and a PN scrambler 116. Generally, message transcoder 112 formats data to be transmitted (e.g. in-phase and quadrature (IQ) data, headers, synchronization data, etc.) into 257-bit transcoded transmission words. RS encoder 114 implements RS (528,514) encoding and thus encodes 20 transcoded transmission words into 5280-bit RS-FEC codewords comprising 514 10-bit message symbols and 14 10-bit parity symbols. PN scrambler 116 implements scrambling by additively combining the 5280-bit RS-FEC codewords with a pseudo-random 5280-bit sequence generated using a linear feedback shift register (LFSR) (see, e.g., Section 5.4.4 of FC-FS-4). A flow diagram illustrating example formats and bit ordering for implementing the transmit operations described herein is shown in FIG. 2.

Those skilled in the art will appreciate that transmitter 102 can include other components not shown in FIG. 1 and/or can be implemented together with other radio base station components not considered components of transmitter 102. However, further details thereof are omitted here for sake of clarity of the invention. Moreover, message transcoder 112, RS encoder 114 and PN scrambler 116 are illustrated separately for ease of illustration. However, some or all of these components may be incorporated together in a common integrated circuit (e.g. processors, ASICs, FPGAs, SOCs, etc.) or a common software or firmware application, or combinations thereof, either alone or along with other components. It should be further appreciated that the principles of the present embodiments can be extended to IP representing integrated circuit designs for implementing the illustrated and other components of transmitter 102.

Figure 3:
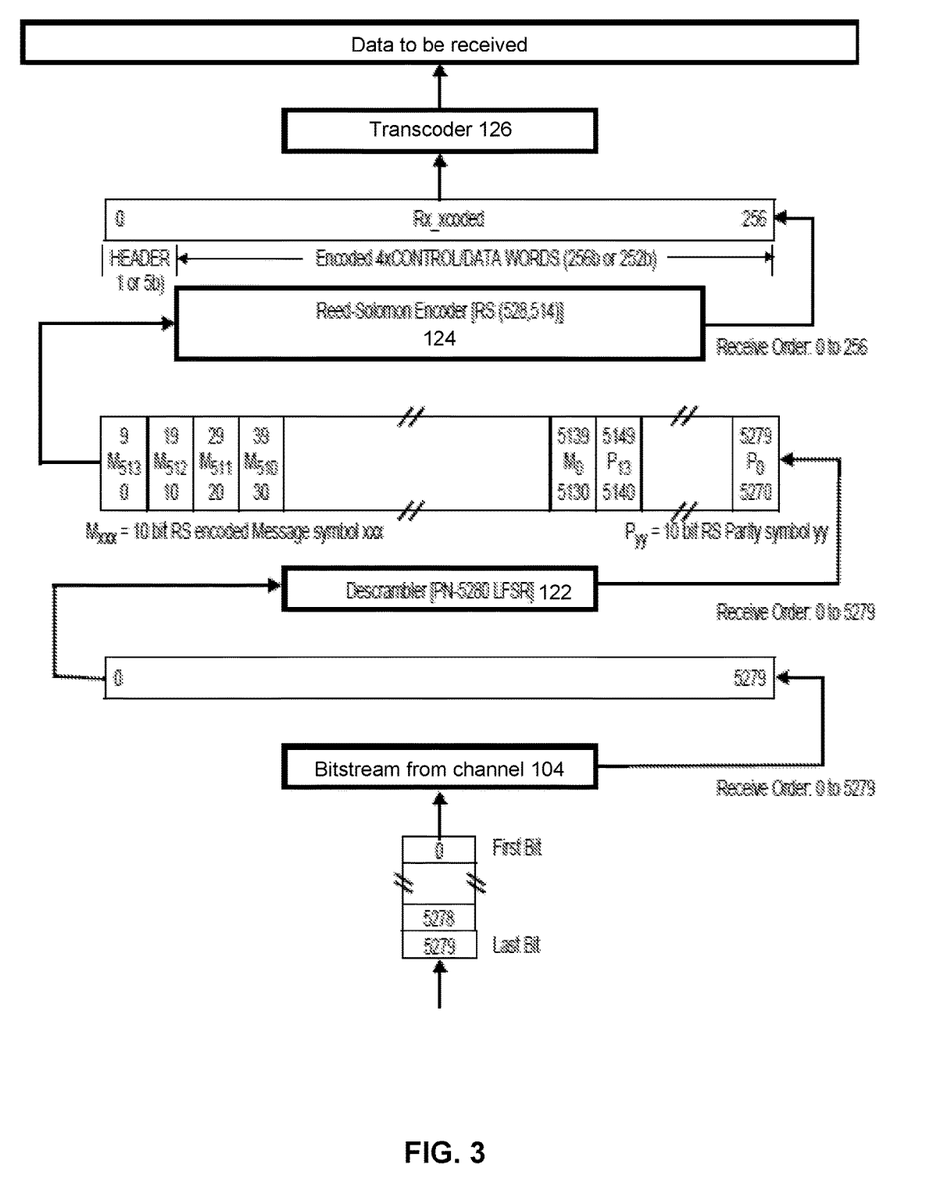
FIG. 3 is a flow diagram illustrating aspects of receive bit ordering in accordance with some of the present embodiments.

Similarly to transmitter 102, receiver 106 can be incorporated in one of a RE and a REC of a radio base station and includes a PN descrambler 122, a RS decoder 124 and a message transcoder 126. Generally, PN descrambler 122 implements descrambling of 5280-bit sequences of a received bitstream by subtracting therefrom the pseudo-random 5280-bit sequence that is generated using the same LFSR as used in the transmitter 102 to thereby extract the 5280-bit RS-FEC codewords. RS decoder 124 implements RS (528,514) decoding, during which RS decoder 124 might perform error correction, the result being a 5140-bit (corrected) message. After performing error correction, if necessary, RS decoder 124 outputs 20 257-bit transcoded transmission words corresponding to the (corrected) 5140-bit message for each inputted 5280-bit RS-FEC codeword. Finally, message transcoder 122 extracts data to be received (e.g. IQ data, headers, synchronization data, etc.) from the 257-bit transcoded transmission words. A flow diagram illustrating example formats and bit ordering for implementing the receive operations described herein is shown in FIG. 3.

As should be appreciated, in order for receiver 106 to successfully operate to extract the data to be received (e.g. IQ data, headers, synchronization data, etc.) from the received bitstream from channel 104 as described above, it needs to know the bit boundaries of the 5280-bit scrambled codewords in the received bitstream. Accordingly, as shown in FIG. 1, receiver 106 further includes a codeword boundary detector 130. As to be described in more detail below, codeword boundary detector 130 operates to identify the previously unknown codeword boundary in the received bitstream and provides this information to PN descrambler 126 so that it can successfully operate to identify the proper 5280-bit sequences corresponding to the RS-FEC codewords in the received bitstream. Codeword boundary detector 130 can operate in a specified sequence (e.g. synchronization sequence, startup sequence, etc.) required in an initialization or other similar non-synchronized state of receiver 106.

Further similarly as set forth above with transmitter 102, those skilled in the art will appreciate that receiver 106 can include other components not shown in FIG. 1 and/or can be implemented together with other radio base station components not considered components of transmitter 106. However, further details thereof are omitted here for sake of clarity of the invention. Moreover, PN descrambler 122, RS decoder 124, message transcoder 126 and codeword boundary detector 130 are illustrated separately for ease of illustration. However, some or all of these components may be incorporated together in a common integrated circuit (e.g. processors, ASICs, FPGAs, SOCs, etc.) or a common software or firmware application, or combinations thereof, either alone or along with other components. It should be further appreciated that the principles of the present embodiments can be extended to IP representing integrated circuit designs for implementing the illustrated and other components of receiver 106.

A conventional codeword boundary detection approach that can be implemented in a receiver in an example application such as that illustrated in FIG. 1 can be described as follows.

Step 1: Accumulate 5280 bits from the received bitstream beginning at a first candidate boundary bit position. This is the current codeword window.

Step 2: Descramble the 5280 bits of the current codeword window by subtracting therefrom the pseudo-random 5280-bit sequence that is generated using the same LFSR used in the transmitter to thereby form a candidate 5280-bit RS-FEC codeword. Store the input 5280-bit data as well as the de-scrambled 5280-bit data.

Step 3: Form 528 symbols (10 bits each), comprising 514 message symbols and 14 parity symbols, from the descrambled candidate 5280-bit codeword.

Step 4: Calculate parity for this candidate codeword. This is done using a LFSR based on the same generator polynomial coefficients for RS(528,514) that are used in the transmitter while encoding the message. If the calculated parity of the complete codeword is 0, the current candidate bit position is considered to be possibly correct. Else go to step 8.

Step 5: Accumulate the next 5280 bits and descramble to get the next 5280-bit codeword. Store the raw and descrambled codeword. Try to do error correction using RS error correction techniques.

Step 6: If the codeword is not correctable, go to step 8. Else, if the codeword is correctable, and the minimum number of error free or correctable codewords has been reached as required by the specification to declare a good codeword boundary, the current candidate bit position is determined to be correct and codeword boundary detection is complete. Go to step 10.

Step 7: Go to step 5 to check if the next codeword is error free or correctable.

Step 8: Else, shift the candidate boundary position by one bit and form the next 5280-bit codeword window by removing the least recently received bit (the first bit of current window) from the input data and adding the next input bit at the end of current window.

Step 9: Go back to step 2 using the next 5280-bit codeword window and repeat until codeword boundary detection is complete.

Step 10: Codeword boundary detection is complete.

The present applicant has recognized many drawbacks with the conventional approach. For example, as described above in step 4, parity symbol generation is typically done using a LFSR based on the RS generator polynomial. If codeword boundary detection is not successful, the results are discarded and the parity is calculated again for the next candidate codeword. Thus, for each successive bit in the bitstream, until codeword boundary detection is complete, the conventional approach requires scrambling of a current 5280-bit codeword window and then performing parity calculation for a completely new 528-symbol candidate codeword.

For RS (528,514) encoding, parity generation using the LFSR based on the RS generator polynomial requires performing 528*14 multiplications. Thus, for each input bit in the input bitstream, the conventional approach requires performing 5280 scrambling operations, 528*14 multiplications and 528*14 additions. Multiplication in particular is a very costly operation in terms of processing resources.

Moreover, if a candidate codeword has a parity error, then the current approach in step 5 requires going through error locator polynomial computation with a complexity one the order of 14^2 multiplications and then performing an exhaustive root search (1024*14 multiplications+1024*14 additions) before concluding whether the error is correctable. This is time-consuming.

The present applicant has further recognized some opportunities to overcome the above and other drawbacks to the conventional approach. For example, the present applicant has recognized that it is not necessary to descramble a 5280-bit code window before performing the remaining codeword boundary detection operations. This is because the scrambler is reset at the start of every codeword in the transmitter. Thus, the scrambling sequence of 5280 bits is fixed and scrambling is reduced to a bitwise xor operation.

Moreover, the applicant has recognized that when the scrambling sequence and a good codeword are additively combined in the transmitter, the parity of the sum is always the same as the parity of the scrambling sequence. So it is only necessary to match the parity of the received vector with this parity to check if the current candidate is a codeword. Since the scrambling sequence is fixed, the parity of the scrambling sequence can be pre-computed, which makes it unnecessary to re-compute it for every new bit in the bitstream, which reduces computation requirements even further.

As another example, the present applicant recognizes that updating the parity symbols of the candidate codeword when a new input bit is shifted into the codeword window can be done efficiently. More particularly, when a new input is shifted in, each message symbol in the candidate codeword is shifted right by one bit. The effects on the parity symbols based on whether the msb of a message symbol is 1 before shifting and whether the lsb of a message symbol is 1 after shifting can be precomputed and used to update parity with a simple bitwise xor operation. Accordingly, as will be apparent from the more detailed descriptions below, updating parity can be made more efficient using this observation.

As yet another example of opportunities for improvement, to check if a candidate codeword has a correctable error, the present applicant has recognized that it is possible to only perform error location polynomial computation without performing an exhaustive root search which is time-consuming, thereby reducing latency. Since typically more than one codeword is found to be correctable before codeword boundary detection is complete, this approximation usually is sufficient. More particularly, if the degree of the error locator polynomial is more than the maximum number of errors which can be corrected (e.g. seven), then it is an uncorrectable error. Moreover, it is checked during root search stage (exhaustively, for example using Chien Search), whether there are actually so many roots or if some roots are repeated. This takes time. So the present applicant has recognized that only error locator polynomial computation can be performed and the result declared correctable/uncorrectable based on whether the degree of the error locator polynomial exceeds the maximum number of errors which can be corrected. If some more error conditions are reached depending on the algorithm used to compute error locator polynomial (for example, the Berkelamp-Massey algorithm), then also it is an uncorrectable error.

Aspects of an example codeword boundary detection approach according to embodiments will now be described in connection with an example methodology shown in FIG. 4. In this example, the following data is needed which can be generated in the beginning and stored.

First, the complete 5280 bit scrambling sequence can be generated from the scrambling polynomial (see, e.g., Section 5.4.4 of FC-FS-4) just once in the beginning. This converts subsequent scrambling into a simple xor operation. Moreover, the parity of this fixed scrambling sequence can be calculated in advance (e.g. using the generator polynomial of the RS(528,514) code described in Equation 91-1 of IEEE 802.3bj-201X) and stored as ParPNSeq[1], 1=0 . . . 13.

The present applicant recognizes that that RS(528,514) coding involves 10-bit symbol arithmetic in a finite field $GF(2^{10})$. This finite field is based on an irreducible polynomial of degree 10. Alpha is a root of this finite field. A 10-bit symbol a9 . . . a0 is actually $a9*(alpha^9)+a8*(alpha^8)+ \ldots a8*(alpha^0)$. Refer to a9 . . . a0 as bits in positions power 9 . . . power 0. Note that $alpha^{(-1)}$ is same as $alpha^{1022}$ and all powers of alpha 0 . . . 1022 can be pre-computed and stored as an exponential table for the finite field.

For each symbol position k=0 . . . 527, normally the symbol is 10 bits. Consider 11-bit extensions of these symbols formed by {symbol[k],1'b0}. Note that while expanding these symbols, msb is at power 9, the old lsb is at power 0 (thus retaining the old symbol) and the new lsb is at power −1. This new lsb is currently 0. When the symbol is shifted right by one position, and bit bnew[k] is shifted in, it becomes {bnew[k],symbol[k]}. Thus, the new symbol has bit shifted in at power 9 and the old symbol shifted right (divided by alpha). The old lsb of the symbol is now at power −1. To get the new symbol value, choose the first 10 bits from left (powers 9 to 0). So, newSymbol[k] is given by (symbol[k]/alpha)^{bnew[k],9'b0}^{10'b0,oldlsb of symbol [k]}. Since {10'b0,oldlsb of symbol[k]} has 11 bits, it can be rounded off to 10 bits using $GF(2^{10})$ arithmetic. It is actually $1*alpha^{(-1)}$ if the old lsb was 1 else it is 0.

For each symbol position k=0 . . . 527 the parity when this symbol is {1'b1,9'b0} or {10'b0,1'b1} and all other symbols are 0 can be calculated in advance (e.g. using the generator polynomial of the RS(528,514) code described in Equation 91-1 of IEEE 802.3bj-201X). These correspond to when the symbol k has a msb of 1 in a 10-bit symbol or when the when the symbol value in this position is alpha^(−1). These are stored in lookup tables as ParMsb1[k] and ParLsb1[k], where each entry in the tables is 140 bits.

Figure 4:
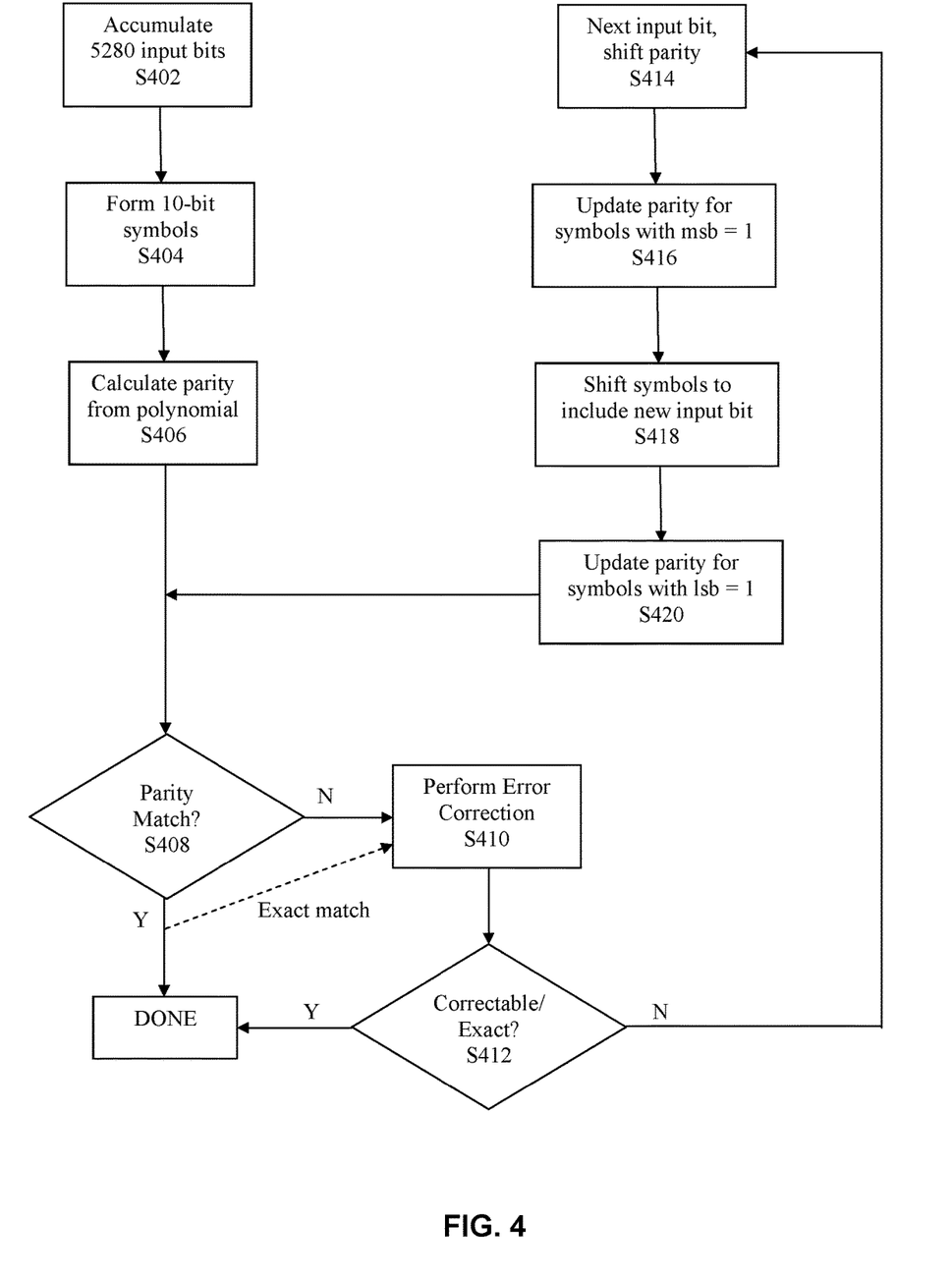
FIG. 4 is a flowchart illustrating an example methodology for performing code boundary detection according to the embodiments.

Now turning to the example methodology in FIG. 4, in an initial step S402, S280 bits are accumulated by the codeword boundary detector 130 from the input bitstream to form an initial 5280-bit received vector.

In step S404, the initial received vector is divided into 528 10-bit symbols. The contents of the received vector corresponding to the 528 symbols of an RS-FEC codeword are denoted as m[k], k=0 . . . 527, where each value of m[k] is 10 bits.

In step S406, the contents of the received vector corresponding to the 528 symbols are used to calculate parity using the generator polynomial of the RS(528,514) code (see, e.g. Equation 91-1 of IEEE 802.3bj-201X). The result is a set of 14 10-bit parity values which are denoted parity[j], j=0 . . . 13.

In step S408, the calculated parity of the received vector is compared with the pre-computed parity of the fixed 5280 bit additive scrambled sequence (i.e. determine if parity[j]= ParPNSeq[1] for all 14 values, j=0 . . . 13). If it is determined in step S408 that they are equal, then a possible good codeword boundary has been detected.

If possible good codeword boundary has been detected, processing branches to step S410 where parity check (e.g. using a LFSR based on the generator polynomial as described above), syndrome computation and subsequent error correction processing is performed on a next accumulated 5280 bits. Here, first a bitwise xor operation is performed between these 5280 bits and the fixed 5280-bit scrambler sequence to get the actual codeword before parity check, etc., is performed.

In some embodiments, in step S410 full error correction is performed on this candidate codeword using known RS error correction techniques as in the conventional approach. In other embodiments, step S410 enables faster lock by either completely avoiding error correction or only performing some error correction functions. For example, to check if there is a correctable error, step S410 can include only performing error location polynomial computation without performing an exhaustive root search which is time-consuming, thereby reducing latency.

As another example, embodiments include an optional "correction bypass" mode in which an exact parity match rather than correctable error is used for locking. For example, step S410 can be performed after a successful match rather than an unsuccessful match, and can cause the method to checking for a threshold number of consecutive parity matches, such as ten consecutive matches. In this example, embodiments detect an "exact" parity match rather than determining whether there is a correctable error. It should be noted that in these embodiments of performing parity match only, descrambling is never required for codeword boundary detection.

After error correction, processing advances to step S412 where it is determined if the error is correctable (or if an "exact" match has been found, in some embodiments). If it is determined in step S412 that the error is correctable, and if a threshold number of codewords with no error or correctable error have been found, then the codeword boundary has been detected and the boundary detection process is complete. In embodiments, if the current codeword either has no error or correctable error, but the threshold number of such codewords has not been reached, step S410 is repeated for successive codewords until the threshold number has been reached or if there is an uncorrectable error.

If it is determined in step S412 that the error is not correctable, processing branches to S414. In step S414 the received vector is updated for the next input bit. In this step, parity of the received vector is also updated by shifting right each 10-bit value of parity[j] j=0 . . . 13 by one bit and rounding off per symbol arithmetic.

Next, in step S416, for each position k=0 . . . 527 for which the symbol m[k] has a lsb of 1, perform a bitwise-xor the current parity with the stored value of ParLsb1[k] (i.e. {parity[j], j=0 . . . 13} is updated to {parity[j], j=0 . . . 13} xor ParLsb1[k]).

Then in step S418, the new received vector is formed by removing the first received bit of the previous current received vector, shifting all bits left by one bit, and updating the most recently received bit of the current received vector with the next input bit from the bitstream. Likewise, update each symbol m[k] k=0 . . . 527 by shifting it right with its lsb going as msb of adjacent symbol m[k+1] and its msb now coming from lsb of adjacent symbol m[k−1]. The msb of symbol m[0] comes from the next received bit of the input stream.

Now in step S420, for each symbol k=0 . . . 527 for which the msb is now 1, xor the current parity with ParMsb1[k] (i.e. {parity[j], j=0 . . . 13} is updated to {parity[j], j=0 . . . 13} xor ParMsb1[k]). After this step is complete, we now have the updated parity[j] of the new current received vector at the next input bit position.

Processing then returns to step S408 for this new candidate codeword boundary position.

It should be apparent that the present embodiments provide many advantages of the conventional approach. For example, it provides a faster locking scheme for additively scrambled Reed-Solomon code data due to the fact that no de-scrambling is required and faster parity updates are performed. Moreover, the additional data required by the embodiments can be pre-computed in the beginning.

Even if an "exact match" lock criteria is used in the conventional approach, the present embodiments provide a faster lock. For example, it ten consecutive parity matches is used as the criteria for locking, the method of the present embodiments is faster because of faster parity updates per input bit.

If correctable error is used as criteria for locking, the method of the present embodiments is faster because of no de-scrambling and using only error locator polynomial evaluation rather than a full root search. It should be noted that full decoding with root searches could be enabled after lock.

As set forth above, if an approach is used with no error correction but only parity match, this approach is much faster. However, to allow downstream circuitry in the receiver to detect that such an approach is being used, received data with correctable errors in the codewords can be sent downstream. Normally, hardware will need a register bit and also a capability advertisement (for example during Auto Negotiation in case of Ethernet) to advertise this correction bypass capability.

It should be further noted that when performing locking using parity with reduced error correction capability, data with codewords having uncorrectable errors may be sent downstream, wherein the corresponding error-locator polynomial is good but it doesn't have as many roots as its degree. In these cases, the fact that the error is uncorrectable is found only during root search stage. But note that the probability of all data having such an error pattern is very low.

It should be still further noted that when data with error is sent to the subsequent layers of the receiver, a mechanism of indicating these errors is provided by the specification (for example, corruption of specified sync headers in IEEE 802.3 Ethernet Clause 91 of IEEE 802.3bj-201X). This indication is done in case of parity mismatch when correction is bypassed and in case of uncorrectable error when correction is enabled.

Figure 5:
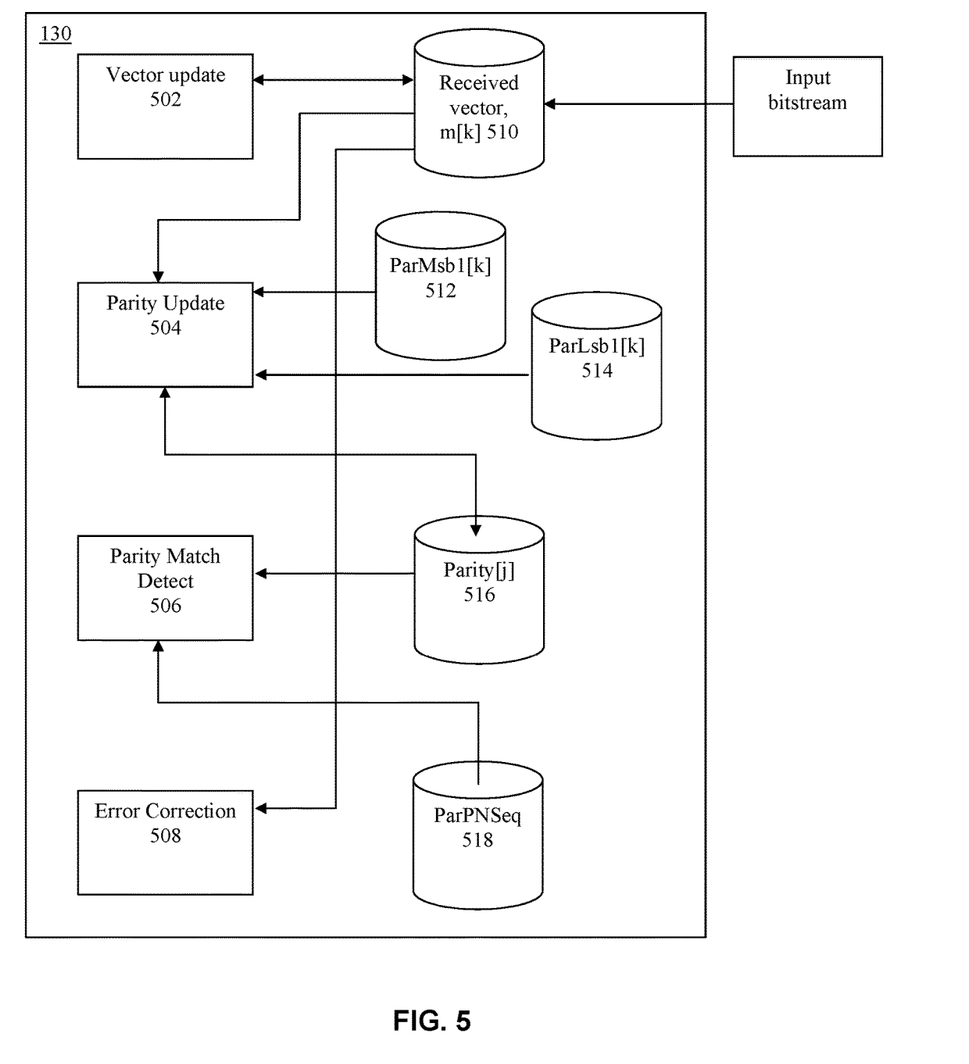
FIG. 5 is a block diagram illustrating an example codeword boundary detector for use in a receiver according to some embodiments.

FIG. 5 is a block diagram of an example codeword boundary detector 130 that can be included in a receiver such as receiver 106 and which can implement a methodology as described above according to embodiments.

As shown, detector 130 includes a vector update module 502 that maintains the received vector and current values of m[k] in 510, and can update these values based on the input bitstream. Parity update module 504 initiates parity[j] 516 and maintains and updates these values for each input bit using the stored values of ParMsb1[k] 512 and ParLsb1[k] 514 as described above. Parity match detect block 506 determines a parity match based on current parity[j] 516 and the stored value of ParPNSeq 518. Error correction block 508 determines whether parity errors are correctable, using conventional RS error correction techniques or any of the alternatives techniques described above in connection with the methodology shown in FIG. 4.

Although the present embodiments have considered the case where the lsb of a 10-bit symbol is received first, it should be readily apparent to those of ordinary skill in the art that changes can be made thereto to work for the cases where the msb of a symbol is received first. The differences lie in the parity update step. The current parity value will be shifted left instead of right (since each symbol is shifted left to get the next input bit in lsb), ParMsb1[k] will hold the parity when the symbol value at position k is alpha^10 and ParLasb1[k] will store the parity when the symbol value at position k is 1. The other steps to update parity remain the same. To get the next candidate codeword from the current codeword, each symbol has its lsb coming from msb of the previous symbol and its msb going as lsb of the next symbol. The lsb of symbol 0 is the next input bit. After these modifications, the scheme of the present embodiments described above is applicable to this case.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method for detecting a boundary of a scrambled codeword in a received bitstream, comprising:
   accumulating, at a receiver from a digital communications channel, a received vector from the received bitstream, the received vector comprising a same number of bits as the scrambled codeword and accumulated beginning at a candidate codeword boundary position in the received bitstream, the same number of bits being partitioned into a set of symbols;
   calculating, by the receiver, parity of the received vector using the set of symbols without performing descrambling of the received vector;
   comparing, by the receiver, the calculated parity to a known parity value that is precomputed and updated using a bitwise logic operation; and
   if the calculated parity equals the known parity value, performing codeword error correction processing and declaring, by the receiver, that a codeword boundary has been detected at the candidate codeword boundary position in the received bitstream based on the received vector and the codeword error correction processing.

2. The method of claim 1, wherein the known parity value is a precomputed parity of a scrambler sequence that is used to generate the scrambled codeword from a codeword to be transmitted.

3. The method of claim 2, wherein the codeword to be transmitted is a Reed-Solomon (RS) codeword.

4. The method of claim 1, wherein the codeword error correction processing is adapted to determine that codeword errors in the received vector are correctable.

5. The method of claim 1, wherein codeword error correction processing includes both error location polynomial computation and exhaustive root search.

6. The method of claim 1, wherein the codeword error correction processing includes error location polynomial computation but does not include exhaustive root search.

7. An apparatus for detecting a boundary of a scrambled codeword in a received bitstream, comprising:
   a receiver adapted to be coupled to a digital communications channel, the receiver including:
      a vector update module that accumulates and updates a received vector from the received bitstream, the received vector comprising a same number of bits as the scrambled codeword and accumulated beginning at a candidate codeword boundary position in the received bitstream, the same number of bits being partitioned into a set of symbols;
      a parity update module that calculates parity of the received vector using the set of symbols, wherein the parity update module is operative to calculate the parity without performing descrambling of the contents of the received vector;
      a parity match detect block that determines a parity match between the calculated parity and a known parity value that is precomputed and updated using a bitwise logic operation; and
      an error correction block that, in response to a determined parity match by the parity match detect block, determines that codeword errors in the received vector are correctable, and thereby determines that the boundary has been detected at the candidate codeword boundary position in the received bitstream based on the received vector; and
   a storage comprising a set of parity values, each of the set of parity values corresponding to possible changes to the set of symbols in the received vector when an updated received vector is accumulated by the vector update module,
   wherein the parity update module is operative to update the calculated parity by performing a logical combination between certain of the set of parity values and the calculated parity.

8. The apparatus of claim 7, wherein the known parity value is a precomputed parity of a scrambler sequence that is used to generate the scrambled codeword from a codeword to be transmitted.

9. The apparatus of claim 8, wherein the codeword to be transmitted is a Reed-Solomon (RS) codeword.

10. The apparatus of claim 7, wherein the storage includes a first set of parity values based on a predetermined value of a most significant bit of the set of symbols and a second set of parity values based on a predetermined value of a least significant bit of the set of symbols.

\* \* \* \* \*